United States Patent [19]
Mehrad et al.

[11] Patent Number: 6,008,516
[45] Date of Patent: Dec. 28, 1999

[54] NON-VOLATILE FLASH LAYOUT

[75] Inventors: Friedoon Mehrad, Plano; Cetin Kaya, Dallas, both of Tex.

[73] Assignee: Texas Instruments Incorporated, Dallas, Tex.

[21] Appl. No.: 09/120,837

[22] Filed: Jul. 22, 1998

Related U.S. Application Data

[60] Provisional application No. 60/053,520, Jul. 23, 1997.

[51] Int. Cl.[6] .................................................. H01L 29/788
[52] U.S. Cl. .......................... 257/315; 257/316; 257/318
[58] Field of Search .................................... 257/315, 316, 257/318

[56] References Cited

U.S. PATENT DOCUMENTS

| | | | |
|---|---|---|---|
| 5,268,319 | 12/1993 | Harari | 437/43 |
| 5,273,926 | 12/1993 | Tigelaar | 437/52 |
| 5,399,891 | 3/1995 | Yiu et al. | 257/316 |
| 5,416,349 | 5/1995 | Bergemont | 257/316 |
| 5,455,792 | 10/1995 | Yi | 365/185.12 |
| 5,467,307 | 11/1995 | D'Arrigo et al. | 365/185.06 |
| 5,471,423 | 11/1995 | Iwasa . | |
| 5,504,706 | 4/1996 | D'Arrigo et al. | 365/185.18 |
| 5,526,307 | 6/1996 | Yiu et al. | 365/185.91 |
| 5,615,153 | 3/1997 | Yiu et al. | 365/185.19 |
| 5,712,500 | 1/1998 | Hsue et al. . | |
| 5,900,661 | 5/1999 | Sato . | |

*Primary Examiner*—Stephen D. Meier
*Attorney, Agent, or Firm*—Jacqueline J. Garner; Wade James Brady; Richard L. Donaldson

[57] ABSTRACT

A FLASH EPROM layout with straight gate and isolation structures to improve scalability and eliminate the need for self-aligned source process.

10 Claims, 3 Drawing Sheets

NON-VOLATILE FLASH LAYOUT

This application claims priority under 35 USC § 119 (e)(1) of provisional application No. 60/053,520, filed Jul. 23, 1997.

BACKGROUND AND SUMMARY OF THE INVENTION

The present invention relates to integrated circuit structures and fabrication methods, and particularly to the layout of arrays of FLASH EPROM cells.

BACKGROUND

Flash Eprom Layout

FLASH memory (also known as FLASH EPROM or FLASH EEPROM) is an array of transistors which use floating gates. The arrays can be written cell by cell, but are erased as blocks of cells or as an entire array.

Referring to FIG. 8, a sample array of memory cells, which is an integral part of a memory chip, is shown. Each cell is a floating-gate transistor 10 having a source 11, a drain 12, a floating gate 13, and a control gate 14. Each of the control gates 14 in a row of cells 10 is connected to a wordline 15, and each of the wordlines 15 is connected to a wordline decoder 16. Each of the sources 11 in a row of cells 10 is connected to a source line 17. Each of the drains 12 in a column of cells 10 is connected to a draincolumn line 18. Each of the source lines 17 is connected by a common-column line 17a to a column decoder 19 and each of the drain-column lines 18 is connected to the column decoder 19. Further discussion of the array can be found in U.S. Pat. No. 5,552,738, which is hereby incorporated by reference.

As dimensions are scaled down in all areas of integrated circuits, the trend in FLASH arrays has been to eliminate as many source/drain contact points as possible, thus avoiding the extra space needed for these structures. A typical FLASH array layout is shown in FIG. 2. Here there are drain contacts 24 for each transistor 10, while a single source contact 26 is made to serve many cells (e.g. 32).

During fabrication of this layout, an etch is used prior to source implantation, to etch through the LOCOS isolation between segments of the source line. This etch and self-aligned source (SAS) implantation is necessary to create the stretched-out source line 17 which serves many cells and to provide the conduction necessary between the source contact 26 and these cells. Due to the selectivity of oxide etch to silicon during the SAS etch, a portion of the poly-silicon wordline is removed during the etch, as well as at least a few hundred angstroms of silicon in the source side of the moat area, as shown in FIG. 3.

Source contacts 26 on vertical source-lines 17a are connected through metal leads and not through the moat under the stack since the source implants might not reach through under the stack. Note that the stacks are designed to "bend" around the locations where a source contact is planned, to accommodate the large area needed for the source contact.

This layout has several problems, including:

Removal of silicon on the source results in less doping concentration at the surface under the stack, and will affect the cell erase performance.

Trenching into silicon is believed to be the source of silicon defects that will result in source/drain shorts, a major reliability problem for FLASH;

Curved stacks are not scalable, and the layout is not easily transferable to smaller dimensions;

Wide vertical source-lines are needed to accommodate the contacts;

Source-line resistances present a problem because of the distance between source contacts and transistors.

Other Flash Layouts

Other layouts for FLASH EPROM have been used, including the H-cell layout shown in FIG. 5, or the X-cell layout of FIG. 6. Discussion of these layouts can be found in U.S. Pat. No. 5,557,569, from which these drawings were taken and which is hereby incorporated by reference.

DISCLOSED STRUCTURES AND METHODS

The present application discloses a layout scheme for FLASH memory arrays which does not need the self-aligned source process, is very scalable and has essentially no source-line resistance. In this scheme, seen in FIG. 1, the isolations are formed in long parallel columns, as in the standard flow. The floating gates and word lines (stacks) are also formed by standard processes, but unlike the X-cell layout and the layout of FIG. 2, the stacks are formed as equidistant straight lines.

Unlike FIG. 2 or the H-cell layout, each source or drain contact in the disclosed layout is shared among 4 cells (with the exception of cells near the edge of the array). Contacts are not square shaped but are long rectangles extending from one moat to another moat by passing over the isolation structure, which are generally LOCal Oxidation of Silicon (LOCOS) or Shallow Trench Isolation (STI). There is no need for a self-aligned source (SAS) etch process since moats are directly contacted. Additionally, a self-aligned contact implant and anneal (SACT) is not necessary when STI is used, although it may be necessary for LOCOS isolation.

Advantages of the disclosed methods and structures include:

Since the SAS etch process is eliminated,
  a) wordlines are not etched (thinned),
  b) silicon trenching is eliminated,
  c) higher source dopant concentration are available under the stack for better erase performance,
  d) defects in silicon and resulting source/drain shorts are eliminated;

Layout is readily scalable and shrinkable for present and future generations;

Process is more manufacturable, since stacks are straight;

Source-line resistance is eliminated;

Problems associated with curving the stack are eliminated;

No SACT implant and anneal is needed if STI process is used (may be needed for LOCOS process);

No extra mask is needed (one less mask if SACT implant needed);

No wide vertical source-lines are needed;

It can easily be used for STI;

Since all the angles are at 90 degrees, it will be advantageous over the X-cells;

Both FLASH EEPROM memory products and embedded FLASH can use this.

BRIEF DESCRIPTION OF THE DRAWING

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Overview of Cell Layout

Figure 1:
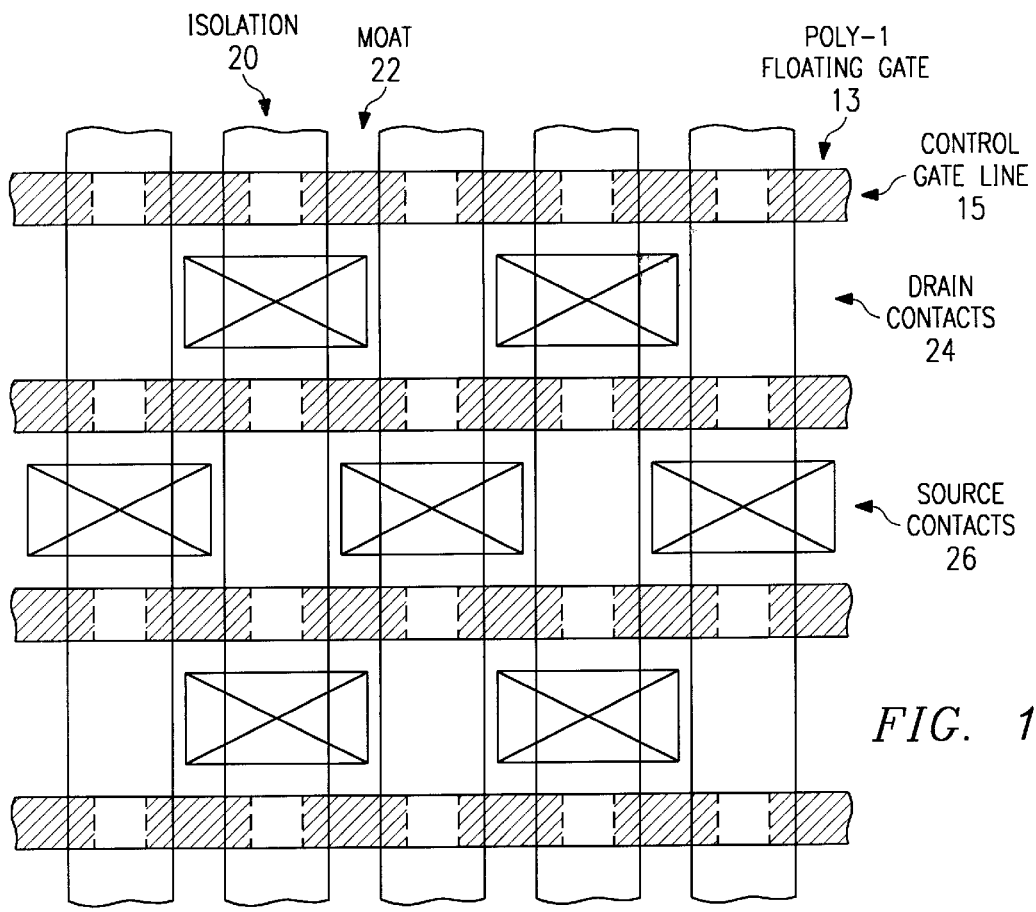
FIG. 1 shows the disclosed layout for an array of FLASH EPROM cells.
Figure 4:
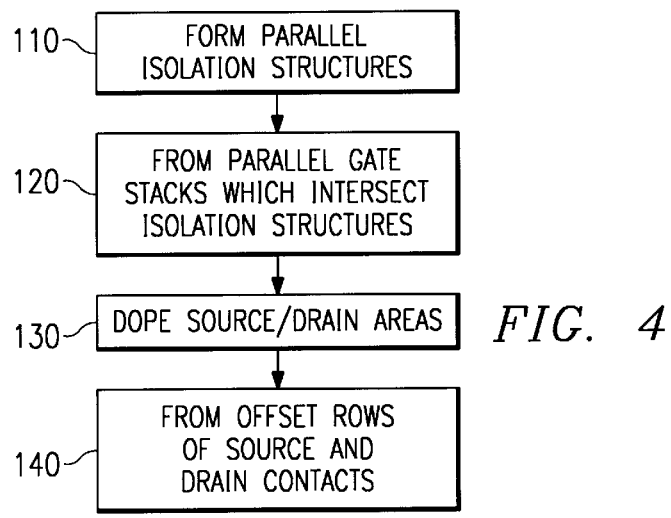
FIG. 4 shows a flow for forming the disclosed layout.
Figure 5:
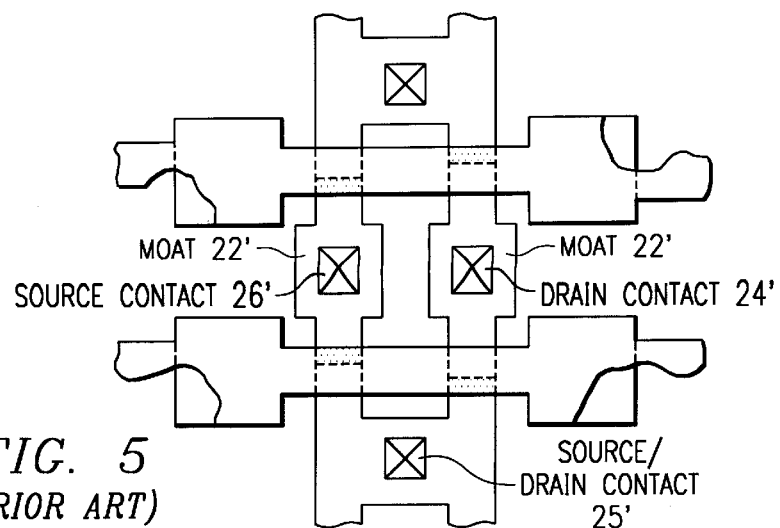
FIG. 5 shows an H-cell FLASH array layout.
Figure 6:
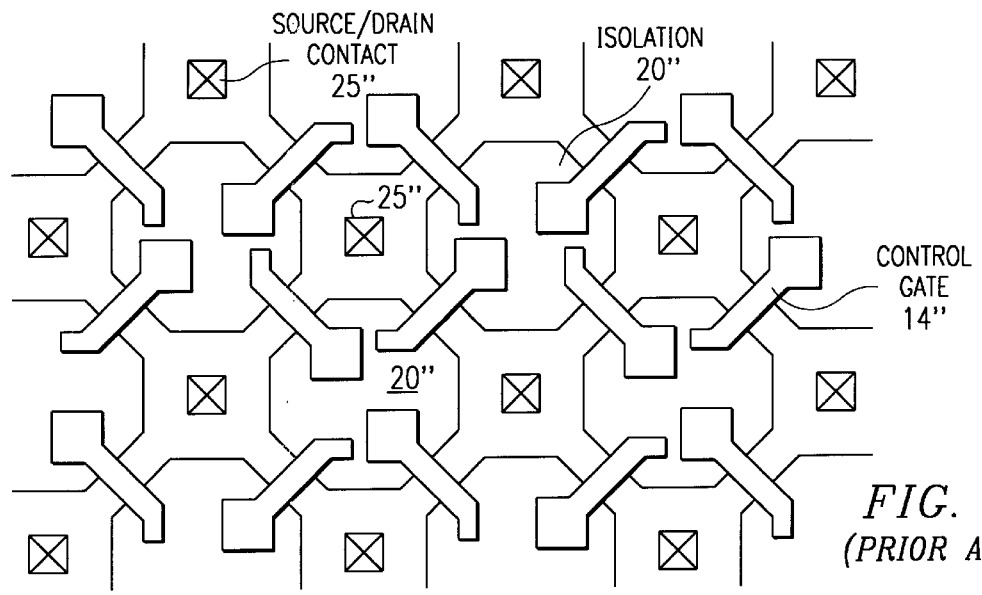
FIG. 6 shows an X-cell FLASH array layout.

The flow for formation of the disclosed cells is shown in FIG. 4, which will now be discussed with reference to FIG. 1, which shows the disclosed structure.

The process begins with the formation of long parallel columns of isolation structures 20, generally of oxide, using standard techniques (step 110). After forming the isolation structures 20, the gate oxide is grown on the moat areas between them. Gate stacks, including poly1 floating gates 13 and poly2 word lines 15 are formed at right angles to the isolation structures (step 120) and are straight lines, unlike the standard structure.

After doping of the source and drain areas (step 130) in alternating rows between the gate stacks, metal source and drain contacts 26 and 24 are formed (step 140). Contacts are formed as long rectangles and extend from one moat 22 to an adjacent moat 22 by passing over the isolation structure 20, so that each contact is shared among 4 cells 10. Of course, at the edges of the array, adjustments will be made to the layout, and not all contacts may control four cells. The drain contacts 24 are offset from the source contacts 26, as shown in FIG. 1, to form a "checkerboard" pattern.

The cell area of the proposed layout is 10% larger than the standard Floating Gate, Avalanche-injection MOS (FAMOS) cell (in 0.35 micron technology, 1.47 square microns versus 1.33 square microns). However, this increase in size is justified by the gains accomplished by this layout and process.

First Isolation Embodiment
LOCOS

In this embodiment, the isolation structures are of thermally grown field oxide, the well-known LOCOS isolation. The fabrication process will typically use a P-type silicon. It starts with growth of a pad oxide layer about 40 nm thick, which is grown or deposited, followed by CVD deposition of a nitride layer. The nitride is patterned and plasma-etched to expose the areas where field isolations are to be grown. A boron implant is performed to create channel stops, then the thick field oxide is thermally grown in a localized oxidation process to a thickness of 600–1,000 nm, using steam at 900 degrees C. and one atmosphere for several hours. Alternatively, a high pressure oxidation (HIPOX) can be used to decrease the oxidation time.

Following removal of the nitride and pad oxide layers, a Vt adjust implant is performed and a gate oxide is formed. A layer of polycrystalline silicon, which will be the floating-gate, is then deposited to a thickness of 100–200 nm, and, if desired, doped and annealed. This layer is then patterned and etched to form the slots between the floating gates. In FLASH memories, the minimum lithographic distance (lambda) determines the width of the slots, while in this layout, the entire cell has an area which is approximately 12 (lambda)squared. The etch is followed by deposition of an inter-level insulator layer, such as oxide/nitride/oxide (ONO) of thickness in the range of 20–40 nm. An N+ doped polysilicon layer and an optional silicide layer, each typically 150–300 nm thick, are then formed over the insulator layer. A cap oxide layer is deposited, followed by patterning and etch of the layers to form the control gate/floating gate stack.

Figure 2:
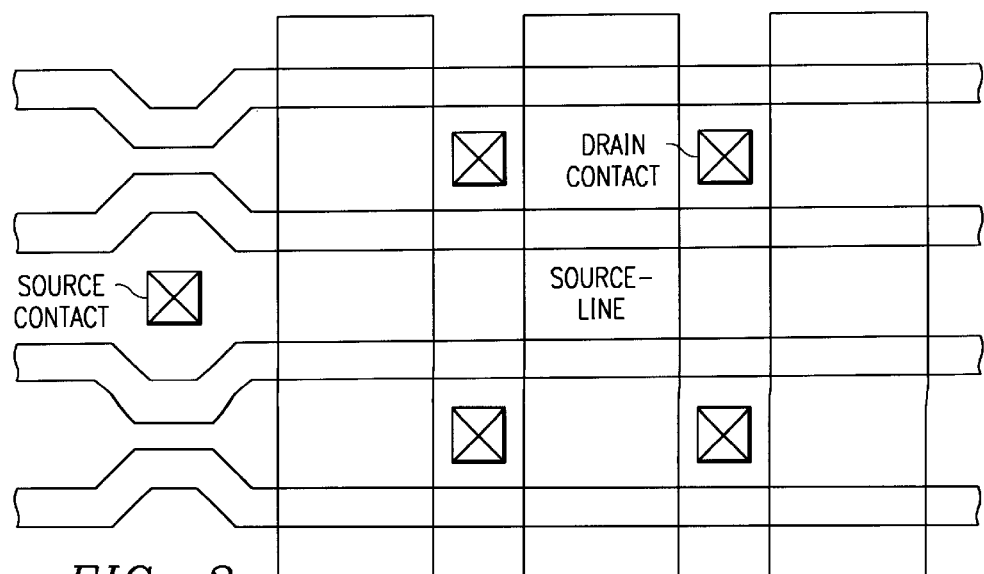
FIG. 2 shows a standard FLASH array layout.
Figure 3:
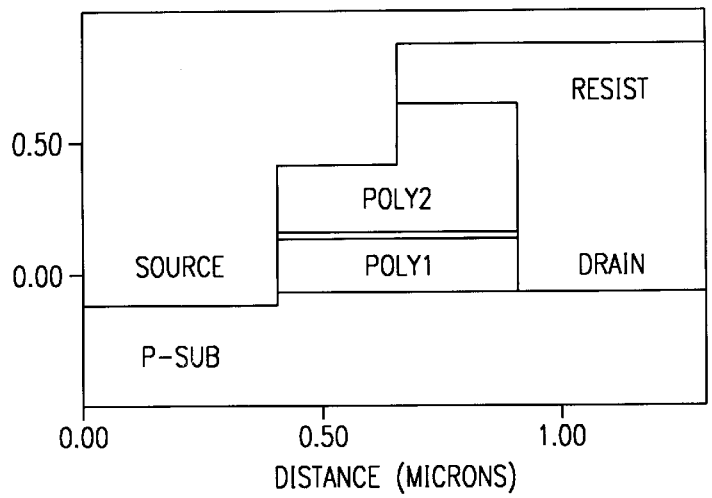
FIG. 3 shows a cross-section of a partially fabricated FLASH EPROM transistor after the self-aligned source etch.

The next step is to implant the source and drain regions. Since each of the cells in the disclosed layout are directly contacted, there is no need for a self-aligned source etch, such as is used in the layout of FIG. 2. The drain region is protected by photoresist while a source implant, typically of phosphorous and arsenic, is performed and annealed. The resist is then stripped and the source is protected by resist while the drain is implanted, typically with arsenic and boron.

Figure 7:
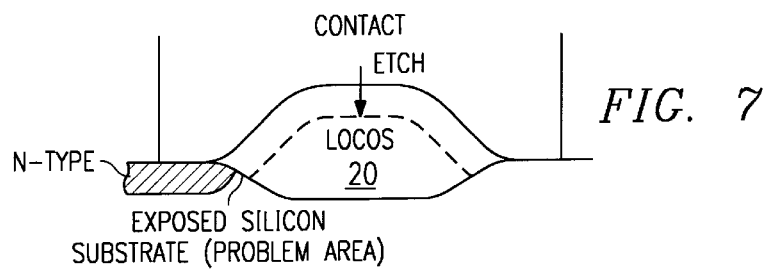
FIG. 7 shows an over-etched field oxide, which would require a SACT implant.
Figure 8:
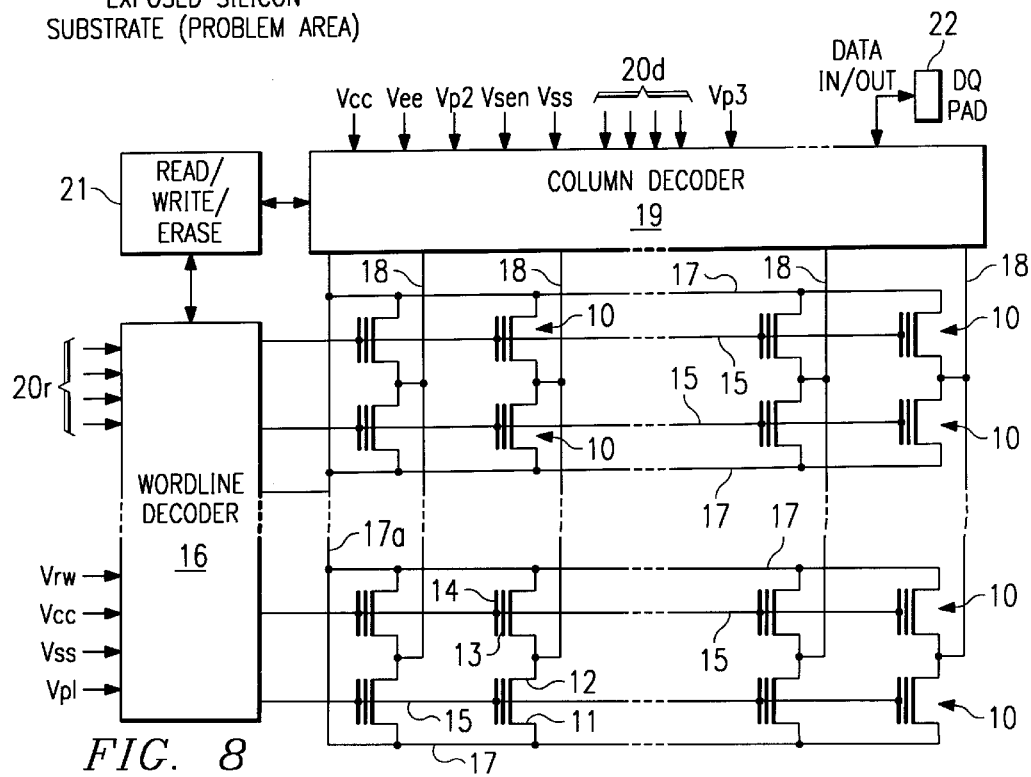
FIG. 8 shows a sample array of FLASH memory cells which can use the disclosed layout.

An oxide layer can be formed after this process on the sides and top of the stack for improved data retention. An interlevel dielectric, e.g., a borophosphosilicate glass (BPSG) over a TEOS-deposited oxide, is then deposited over the face of the slice, then resist is deposited and patterned for the etch to the contacts. The source/drain contacts will all overlap the LOCOS isolation. Since the LOCOS isolation has edges which are thinner than the rest of the LOCOS, any over-etch can remove the edges of the LOCOS isolation, exposing undoped silicon, as shown in FIG. 7. If uncorrected, this would cause a short to the substrate, but a well known solution calls for a self-aligned implant and anneal (SACT) while the contact etch mask is still in place.

Second Isolation Embodiment
STI

This embodiment is similar to the first embodiment above, with the exception that, rather than growing the LOCOS isolation, shallow trenches are etched into the silicon, then filled with oxide to serve as isolation structures. Like the LOCOS embodiment, there is no need for a self-aligned source etch, since each cell is directly contacted for both source and drain. Since the trench isolation does not have the thin edges of oxide that LOCOS has, a SACT implant and anneal are unnecessary in this embodiment.

First Metallization Embodiment
Aluminum

In a first embodiment, the metallization is aluminum. During metallization of the disclosed array, landing pads are placed on top of the source contacts during metal-1, and connected by metal-2. Drain contacts and word-line strapping are all by metal-1.

Second Metallization Embodiment
Aluminum with Tungsten Plugs

As an alternative approach for metallization, tungsten plugs with Ti/TiN liner can be formed in metal-0 to make the contacts. Aluminum in metal-1 will reach the contacts through the plugs.

Alternate Embodiment
EEPROM

Although the primary disclosed embodiment is for an EPROM array, this layout can also be used for EEPROM, where cells are erased individually.

According to a disclosed class of innovative embodiments, there is provided: An electrically programmable and erasable FLASH memory array structure, comprising: isolation structures formed in proximity to a first surface of a substantially monolithic semiconductor material, said isolation structures being formed in substantially straight parallel lines separated by moat areas; gate stacks which contain patterned floating gates and which form substantially straight lines, said moat areas and said gate stacks intersecting at cell locations; source contacts and drain contacts, wherein a plurality of said source and drain contacts each cross a respective isolation structure to provide contact to said moat areas of four of said cells, said source contacts being offset from said drain contacts.

According to another disclosed class of innovative embodiments, there is provided: A fabrication method for a non-volatile memory cell, comprising the steps of: (a.) forming isolation structures in substantially parallel straight lines in proximity to a first surface of a substantially monolithic semiconductor material, said isolation structures being separated by moat areas; (b.) forming gate stacks in substantially straight parallel lines which intersect said moat areas at cell locations, said gate stacks having floating gates; (c.) forming source and drain contact structures such that a plurality of said source and drain contact structures each contact moat regions of four transistors, said source contacts being offset from said drain contacts.

MODIFICATIONS AND VARIATIONS

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

For example, other isolation structures may be used instead of LOCOS or STI.

For an alternative embodiment, the layers in the gate stack could be different materials.

Alternatively, other metallizations can be used, such as copper.

Alternatively, other dopants can be used, or in different combinations than stated.

What is claimed is:

1. An electrically programmable and erasable FLASH memory array structure, comprising:
    isolation structures formed in proximity to a first surface of a substantially monolithic semiconductor material, said isolation structures being formed in substantially straight parallel lines separated by moat areas;
    gate stacks which contain patterned floating gates and which form substantially straight lines, said moat areas and said gate stacks intersecting at cell locations;
    source contacts and drain contacts, wherein a plurality of said source and drain contacts each cross a respective isolation structure to provide contact to said moat areas of four of said cells, said source contacts being offset from said drain contacts.

2. The integrated circuit of claim 1, wherein said isolation structures are thermally grown field oxides.

3. The integrated circuit of claim 1, wherein said isolation structures are trenches filled with oxide.

4. The integrated circuit of claim 1, wherein said source contacts and said drain contacts are substantially rectangular.

5. The integrated circuit of claim 1, wherein all of said source and drain contacts in the interior of the array each contact four of said cells.

6. A fabrication method for a non-volatile memory cell, comprising the steps of:
    (a.) forming isolation structures in substantially parallel straight lines in proximity to a first surface of a substantially monolithic semiconductor material, said isolation structures being separated by moat areas;
    (b.) forming gate stacks in substantially straight parallel lines which intersect said moat areas at cell locations, said gate stacks having floating gates;
    (c.) forming source and drain contact structures such that a plurality of said source and drain contact structures each contact moat regions of four transistors, said source contacts being offset from said drain contacts.

7. The method of claim 6, wherein said isolation structures are of thermally-grown field oxide.

8. The method of claim 6, wherein said isolation structures are trenches filled with oxide.

9. The method of claim 6, wherein each memory cell is directly contacted by ones of said source and drain contact structures.

10. A product produced by the method of claim 6.

* * * * *

UNITED STATES PATENT AND TRADEMARK OFFICE
CERTIFICATE OF CORRECTION

PATENT NO. : 6,008,516
DATED : December 28, 1999
INVENTOR(S) : Freidoon Mehrad, Cetin Kaya It is certified that error appears in the above-identified patent and that said Letters Patent is hereby corrected as shown below:

Title page, column 1,
Please insert the following: "Inventors" -- [75] Freidoon Mehrad, Cetin Kaya --

Signed and Sealed this

Twenty-eighth Day of August, 2001

*Attest:*

NICHOLAS P. GODICI
*Attesting Officer*   *Acting Director of the United States Patent and Trademark Office*